United States Patent [19]
Takata et al.

[11] Patent Number: 5,703,804
[45] Date of Patent: Dec. 30, 1997

[54] SEMICONDUCTOR MEMORY DEVICE

[75] Inventors: Hidekazu Takata, Nara-ken, Japan; Thomas Mnich, Woodland Park, Colo.; David Novosel, New Wilmington, Pa.

[73] Assignee: Sharp Kabushiki K.K., Osaka, Japan

[21] Appl. No.: 723,963

[22] Filed: Sep. 26, 1996

[51] Int. Cl.$^6$ ............................................. G11C 11/22
[52] U.S. Cl. .................. 365/145; 365/189.09; 365/226; 365/230.06
[58] Field of Search ..................... 365/145, 189.09, 365/226, 228, 230.06, 189.11

[56] References Cited

U.S. PATENT DOCUMENTS

| | | | |
|---|---|---|---|
| 5,532,953 | 7/1996 | Ruesch et al. | 365/145 |
| 5,615,145 | 3/1997 | Takeuchi et al. | 365/145 |
| 5,619,470 | 4/1997 | Fukumoto | 365/145 |

FOREIGN PATENT DOCUMENTS

| | | |
|---|---|---|
| 3-283176 | 12/1991 | Japan . |
| 7-182872 | 7/1995 | Japan . |

*Primary Examiner*—Son T. Dinh

[57] ABSTRACT

A semiconductor memory device includes: a plurality of bit lines disposed on a substrate; a plurality of word lines and a plurality of data lines disposed on the substrate in a direction crossing with the bit lines; a plurality of memory cells disposed in a matrix at portions corresponding to respective crossing points of the bit lines and the word lines, each of the plurality of memory cells having at least one switching transistor and at least one ferroelectric capacitor including a ferroelectric film as an insulating film to form a non-volatile ferroelectric memory storing information by a polarization direction of the ferroelectric film; a substrate voltage generating circuit which supplies a negative substrate voltage to the substrate; and a power-on reset circuit which output and applies a predetermined positive voltage to the word lines during a time period from a power-on until the substrate voltage is stabilized.

5 Claims, 8 Drawing Sheets

Read of data "1"

SEMICONDUCTOR MEMORY DEVICE

BACKGROUND OF THE INVENTION

1. Field of the Invention

The present invention relates to a semiconductor memory device, and particularly to a non-volatile semiconductor memory device storing information by using a polarization state of a ferroelectric material disposed between electrodes of a ferroelectric capacitor.

2. Description of the Related Art

A semiconductor memory device utilizing a ferroelectric material for storing information (ferroelectric random access memory (FRAM); hereinafter, also referred to as a "ferroelectric memory") is a non-volatile memory storing binary information by using the direction of polarization of a ferroelectric material. FIG. 3 shows a configuration of a typical ferroelectric memory.

More specifically, FIG. 3 shows a pair of bit lines BL and /BL adjacent to each other among a plurality of bit lines, which are arranged parallel with each other in a column direction, and the related circuit configuration.

The bit line /BL is called a complementary bit line with respect to the bit line BL. In the following description, the sign "/BL" is used for designating the complementary bit line, while the sign "BL" is used therefor in the drawings.

One end of both the bit line BL and the complementary bit line /BL is connected to a sense amplifier 30 which amplifies and detects an electric potential difference between the bit line BL and the complementary bit line /BL. A plurality of word lines 28 parallel with each other and a plurality of drive lines DL parallel with each other are disposed in a row direction orthogonal to the bit lines BL and /BL. The word lines 28 and the drive lines DL are alternately disposed.

A plurality of memory cells 25 are connected between the bit line BL and the complementary bit line /BL adjacent to each other. The memory cells 25 are arranged in a matrix as a whole so as to correspond to crossing points of the bit lines BL and /BL and the word lines 28 and the drive lines DL.

Each memory cell 25 includes two ferroelectric capacitors 23 and 24 (hereinafter, simply also referred to as the "capacitors"), each of which is configured by disposing a ferroelectric film between two electrodes opposing each other. Each memory cell 25 also includes N-channel MOS transistors 21 and 22 connected between the capacitor 23 and the bit line BL and between the capacitor 24 and the bit line /BL, respectively. A drain, gate, and source of the MOS transistor 21 are connected to the bit line BL, the word line 28, and one electrode of the capacitor 23, respectively. A drain, gate, and source of the MOS transistor 22 are connected to the complementary bit line /BL, the word line 28, and one electrode of the capacitor 24, respectively. The respective other electrodes of the capacitors 23 and 24 are connected to the drive line DL.

In the conventional ferroelectric memory with the above-mentioned configuration, binary data "0" and "1" are written in a memory cell as follows.

First, a write operation of data "1" will be described with reference to FIGS. 4A, 4B, 5A, and 5B.

As shown in FIG. 4A, a positive power source voltage Vcc is supplied to the bit line BL corresponding to a memory cell to which data "1" will be written. Simultaneously, an electric potential at a GND level, i.e., a ground electric potential (in particular 0 volt), is supplied to the complementary bit line /BL. Furthermore, the corresponding word line 28 is set at a high level, so the MOS transistors 21 and 22 included in the memory cell to which data "1" will be written are turned on. This allows the power source voltage Vcc to be supplied to one electrode of the capacitor 23 and the electric potential at the GND level to be supplied to one electrode of the capacitor 24.

At this time, a pulse voltage rising from the GND level to the Vcc level and then falling to the GND level as shown in FIG. 4B is applied to the corresponding drive line DL. While the electric potential of the drive line DL is at the GND level, a voltage at a level corresponding to the power source voltage Vcc is applied between the electrodes of the capacitor 23, whereby an electric filed Evcc is generated between the electrodes. Due to the electric field Evcc, electric charge Ps shown in FIG. 5A is accumulated in the capacitor 23. When the electric potential of the drive line DL rises to the Vcc level under this state, no voltage is applied between the electrodes of the capacitor 23 any more, and thus, the electric field Evcc is not applied, either. However, electric charge Pr shown in FIG. 5A remains in the capacitor 23 due to a polarization phenomenon of a ferroelectric film included in the capacitor 23 even under this state.

On the other hand, when the electric potential of the drive line DL is at the GND level, no voltage is applied between the electrodes of the capacitor 24. When the electric potential of the drive line DL rises to the Vcc level under this condition, a negative voltage −Vcc is applied between the electrodes of the capacitor 24, and a negative electric field −Evcc is generated between the electrodes. Due to the electric field −Evcc, electric charge −Ps shown in FIG. 5B is accumulated in the capacitor 24. When the electric potential of the drive line DL falls to the GND level under this state, no voltage is applied between the electrodes of the capacitor 24 any more, and thus, the electric field −Evcc is not applied, either. However, electric charge −Pr shown in FIG. 5B remains in the capacitor 24 due to a polarization phenomenon of a ferroelectric film included in the capacitor 24 even under this state.

The residual electric charge Pr and −Pr given in the capacitors 23 and 24 as described above remains therein even when the power source voltage Vcc is not applied to the memory cell. Thus, information is stored in a non-volatile manner by utilizing the remaining electric charge Pr and −Pr.

The write operation of data "0" is realized by inverting the level of voltages to be supplied to the bit line BL and the complementary bit line /BL, with respect to the write operation of data "1" described above. More specifically, by supplying the voltage at the GND level to the bit line BL and the power source voltage Vcc to the complementary bit line /BL, the charge −Pr remains in the capacitor 23 and the charge Pr remains in the capacitor 24. Thus, data "0" is written in the memory cell.

The data which has been written as described above is read as follows.

The read operation of data "1" will be described with reference to FIGS. 6A, 6B, 7A, and 7B.

Prior to starting a read operation, the bit line BL and the complementary bit line /BL are discharged in such a manner that the respective electric potentials are set a the GND level, as shown in FIG. 6A. Then, the electric potential of the word line 28 is set at a high level and the MOS transistors 21 and 22 are turned on, whereby a read operation is started. The electric potential of the drive line DL at the GND level at this moment is raised to the Vcc level at an appropriate time, as shown in FIG. 6B.

In the case of reading data "1", an electric field in a direction opposite to that for writing data "1" is applied to the capacitor 23 in accordance with changes in the electric potential of the drive line DL. This causes the polarization of the ferroelectric film included in the capacitor 23 to be inverted. Consequently, the accumulation condition of electric charge in the capacitor 23 is reversed, as shown in FIG. 7A. On the other hand, an electric field in a direction identical with that for writing data "1" is applied to the capacitor 24, so that the polarization of the ferroelectric film included in the capacitor 24 is not inverted. Consequently, the accumulation condition of electric charge in the capacitor 24 is not reversed, while the amount of the accumulated charge is slightly changed, as shown in FIG. 7A.

Into the bit line BL and the complementary bit line /BL, electric charge is provided, the amount of which depends on the changes of the accumulated charge described above. At this time, the electric potential of the bit line BL is slightly higher than that of the complementary bit line /BL due to the difference in the amount of electric charge flowing into the bit line BL and the complementary bit line /BL. The sense amplifier 30 (see FIG. 3) amplified and detects the electric potential difference between the bit line BL and the complementary bit line /BL. Thus, data "1" which has been recorded is read.

In the case of reading data "0", an electric field in a direction opposite to that for writing data "0" in a direction opposite to that for writing data "0" is applied to the capacitor 24 in accordance with changes in the electric potential of the drive line DL. This causes the polarization of the ferroelectric film included in the capacitor 24 to be inverted. Consequently, the accumulation condition of electric charge in the capacitor 24 is reversed. On the other hand, an electric field in a direction identical with that for writing data "0" is applied to the capacitor 23, so that the polarization of the ferroelectric film included in the capacitor 23 is not inverted. Consequently, the accumulation condition of electric charge in the capacitor 23 is not reversed, while the amount of the accumulated charge is slightly changed.

Into the bit line BL and the complementary bit line /BL, the electric charge is provided, the amount of which depends on the changes of the accumulated charge described above. At this time, the electric potential of the complementary bit line /BL is slightly higher than that of the bit line BL due to the difference in the amount of electric charge flowing into the bit line BL and the complementary bit line /BL. The sense amplifier 30 (see FIG. 3) amplifies and detects the electric potential difference between the bit line BL and the complementary bit line /BL. Thus, data "0" which has been recorded is read.

As described above, in the ferroelectric memory, the polarization inversion phenomenon of the ferroelectric film repeatedly occurs when data is written and read. When the number of times of polarization inversion increases, polarization characteristics gradually degrade, making it difficult to maintain the polarization while no power source voltage is applied to a memory cell. The polarization inversion also requires a predetermined period of time. Therefore, there is a certain limit to reading speed.

In connection with these disadvantages, Japanese Laid-Open Patent Publication Nos. 3-283176 and 7-182872 discloses a method in which a ferroelectric memory is allowed to work as a non-volatile memory at power-on, allowed to work as a volatile memory (i.e., a DRAM) during a normal operation after the power-on, and allowed to work as a non-volatile memory immediately before the power-off. While the ferroelectric memory works as a DRAM, write and read operations are conducted by the injection (accumulation) and discharge of electric charge. Thus, according to this method, a polarization inversion phenomenon does not occur during normal read and write operations, so that polarization characteristics of the ferroelectric film are not likely to degrade.

More specifically, during a normal operation, the ferroelectric memory is allowed to work as DRAM by setting the electric potential of a drive line at a power source voltage Vcc. Before the power-off, the ferroelectric memory conducts a write operation utilizing the polarization inversion phenomenon described above, whereby non-volatile information is stored in a memory cell. When the electric potential of the drive line is set at the power source voltage Vcc, information is not inverted irrespective of whether a voltage applied to the charge-accumulated node of a ferroelectric capacitor is at the GND level or the Vcc level. This prevents a ferroelectric material in the ferroelectric capacitor from degrading. Futhermore, the disadvantages relating to the limit of reading speed can be overcome.

Upon the power-on, the ferroelectric memory conducts a read operation utilizing the polarization inversion phenomenon described above, whereby non-volatile information which has been recorded is read from a memory cell. Thus, the function as a non-volatile memory can be effectively realized.

Furthermore, as conventionally conducted in DRAMs, it is desired that a negative voltage is applied to a substrate with a memory formed theron. The purpose therefor is to decrease a sub-threshold current of a transistor included in a memory cell as well as to increase a voltage for reading data from a memory cell to a bit line by reducing a junction capacitance relating to the bit lines.

However, in the conventional ferroelectric memory having the above characteristics, the following problems are caused at the power-on.

The word lines, the bit lines, and the drive lines are all set at the GND level at the power-on. As for the charge-accumulated node of the ferroelectric capacitor, no external electric field is applied thereto, while some polarization exists therein irrespective of a state of non-volatile data. Thus, the electric potential of the charge-accumulated node is in a floating condition. However, a transistor included in a memory cell is in an OFF-state, so that the ferroelectric capacitor is in a high impedance state. Therefore, the electric potential state of the charge-accumulated node is likely to fluctuate due to external disturbances.

When a negative substrate voltage VBB is generated in this condition, the electric potential of the charge-accumulated node of the ferroelectric capacitor formed on the substrate is lowered in a negative direction through a junction capacitance with the substrate. When the negative substrate voltage VBB exceeds a level corresponding to a coercive electric field for the ferroelectric film included in the ferroelectric capacitor (i.e., the lowest electric field at which spontaneous polarization of the material constituting the ferroelectric film is inverted), the polarization direction corresponding to data "1" is inverted, whereby non-volatile data which has been recorded may be damaged.

The value of the coercive electric field (i.e., the voltage level corresponding to the coercive electric field) varies depending upon the ferroelectric material. In general, its level decreased with the decrease in the power source voltage of the ferroelectric memory due to its miniaturization. Thus, a small negative substrate voltage VBB may damage non-volatile data.

SUMMARY OF THE INVENTION

The semiconductor memory device of the present invention includes: a plurality of bit lines disposed on a substrate;

a plurality of work lines and a plurality of data lines disposed on the substrate in a direction crossing with the bit lines; a plurality of memory cells disposed in a matrix at portions corresponding to respective crossing points of the bit lines and the word lines, each of the plurality of memory cells having at least one switching transistor and at least one ferroelectric capacitor including a ferroelectric film as an insulting film to form a non-volatile ferroelectric memory storing information by a polarization direction of the ferroelectric film; a substrate voltage generating circuit which supplied a negative substrate voltage to the substrate; and a power-on reset circuit which applies output which is a predetermined positive voltage selectively to at least one of the plurality of the word lines during a time period from a power-on until the substrate voltage is stabilized.

Preferably, the output of the power-one reset circuit is at a high level during the time period from the power-on until the substrate voltage is stabilized, and turns low after the time period.

Preferably, the semiconductor memory device further includes first connecting means for applying a boosted voltage to the word lines and second connecting means for applying the output of the power-on reset circuit to the word lines.

Preferably, the semiconductor memory device further includes means for setting, at a predetermined level, an electric potential of a selected one of the plurality of the bit lines corresponding to a selected one of the plurality of the memory cells in the time period during which the output of the power-on reset circuit is applied to the word lines to set a voltage applied to the ferroelectric film of the ferroelectric capacitor at a value lower than a minimum voltage at which the polarization direction of the ferroelectric film is inverted. The predetermined level for the electric potential of the selected bit line can be a ground potential.

As described above the semiconductor memory device of the present invention includes a power-on reset circuit applying a predetermined positive voltage selectively to the word line throughout a time period during which a substrate voltage is stabilized after the power-on. When a positive voltage is applied to the word line by the power-on reset circuit throughout the time period during which the substrate voltage starts being generated to sufficiently stabilize at the power-on, the transistor included in a memory cell is turned on, and the bit line and the charge-accumulated node of the ferroelectric capacitor become electrically conductive through the transistor. Thus, the electric potential of the charge-accumulated node of the ferroelectric capacitor is clamped to the same level as that of the bit line.

Preferably, further provided is means for setting the electric potential of the bit line (in particular, the one to which the ferroelectric capacitor is not connected) at the predetermined level during the time period while the output of the power-on reset circuit (the predetermined positive voltage) is applied to the word lines, so that a voltage applied to the ferroelectric film of the ferroelectric capacitor is set at a value lower than the minimum voltage at which the poralization direction of the ferroelectric film is inverted. In particular, the electric potential of the bit line (it is also referred to as the "bit line potenital" in this application) is set at the ground potential. In the above-mentioned process, the electric potential of the charge-accumulated node of the ferroelectric capacitor is clamped to the same potential level as that of the bit lines (for example, at the ground level). By setting the bit line potential as described above, even when the electric potential of the junction of the ferroelectric capacitor is subject to decrease through coupling with the substrate while the substrate voltage is decreasing, the coupling effect is cancelled. Thus, the electric potential of the charge-accumulated node of the ferroelectric capacitor is prevented from changing toward a negative level.

Therefore, even when the substrate voltage starts being generated and reaches a negative electric potential, the electric potential of the charge-accumulated node is not lowered in a negative direction. As a result, the ferroelectric film included in the ferroelectric capacitor is not applied with an electric field which is beyond the coercive electric field thereof. Thus, the non-volatile data recorded by utilizing a polarization state of the ferroelectric film is prevented from being damaged.

Thus, the invention described herein makes possible the advantage of providing a ferroelectric memory which records non-volatile data utilizing a polarization phenomenon of a ferroelectric film forming a ferroelectric capacitor, in which a polarization inversion phenomenon is prevented from occurring at an undesired time so as to protect recorded non-volatile data from being damaged.

This and other advantages of the present invention will become apparent to those skilled in the art upon reading and understanding the following detailed description with reference to the accompanying figures.

DESCRIPTION OF THE PREFERRED EMBODIMENTS

Figure 1:
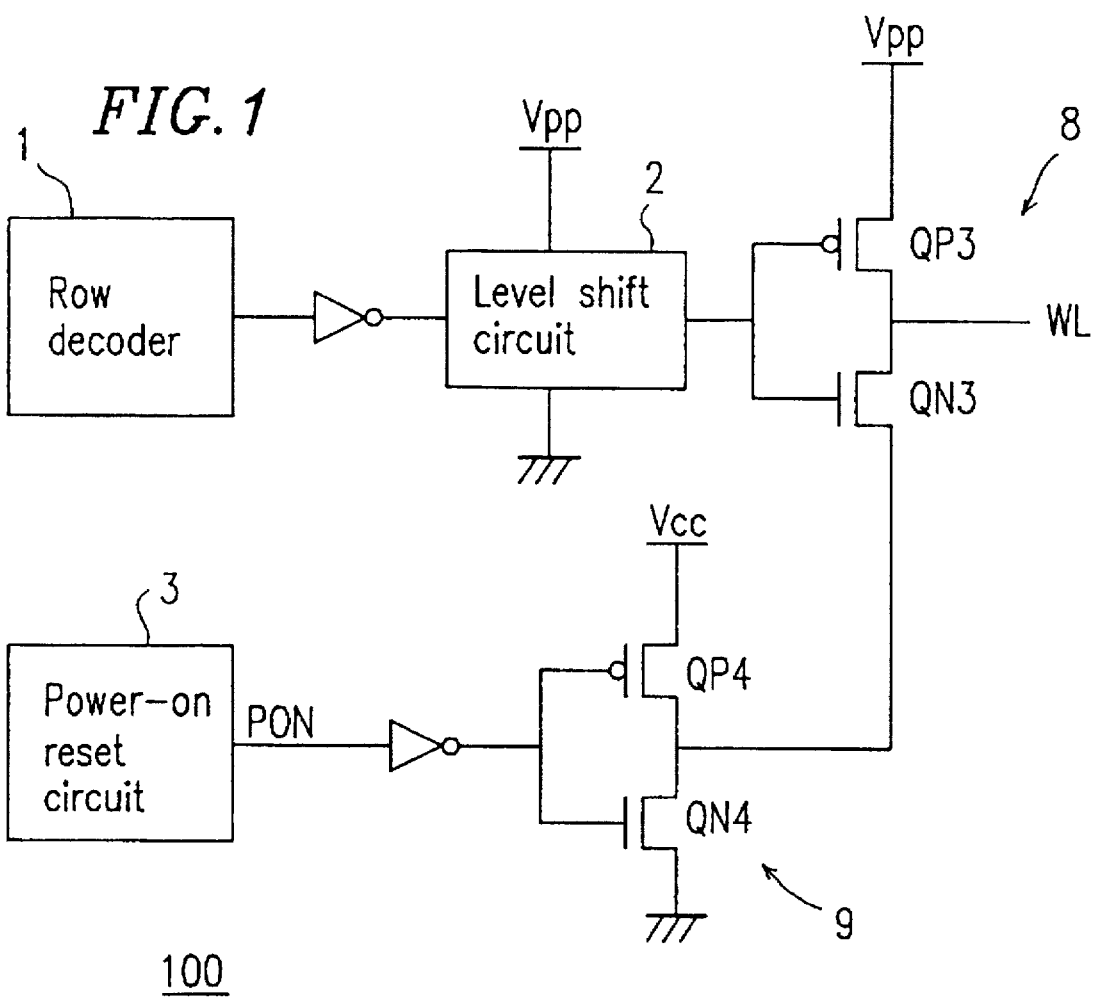
FIG. 1 is a diagram showing a configuration of a word line driving circuit included in a non-volatile semiconductor memory device of the present invention.
Figure 3:
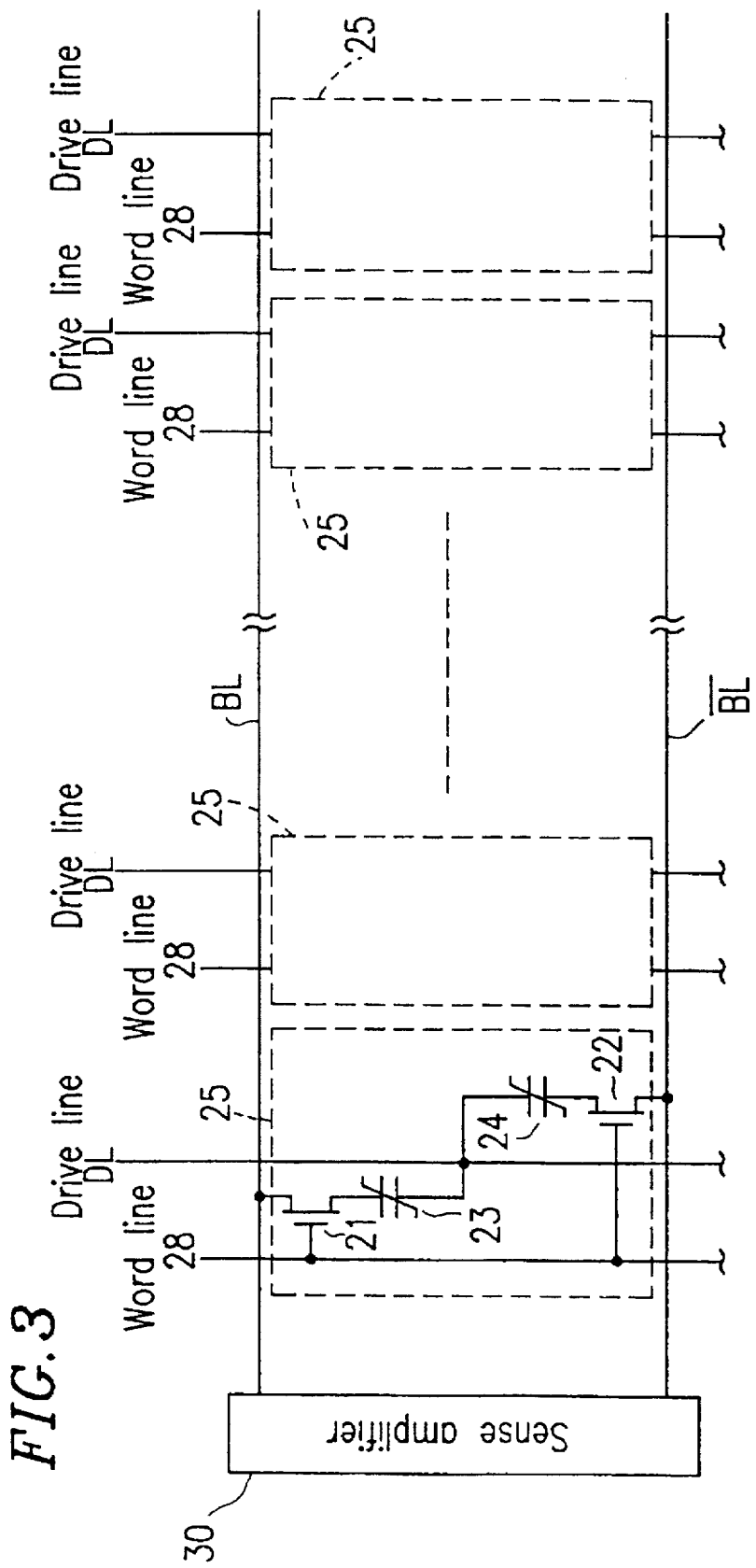
FIG. 3 is a diagram showing a typical configuration of a non-volatile semiconductor memory device.
Figure 4A:
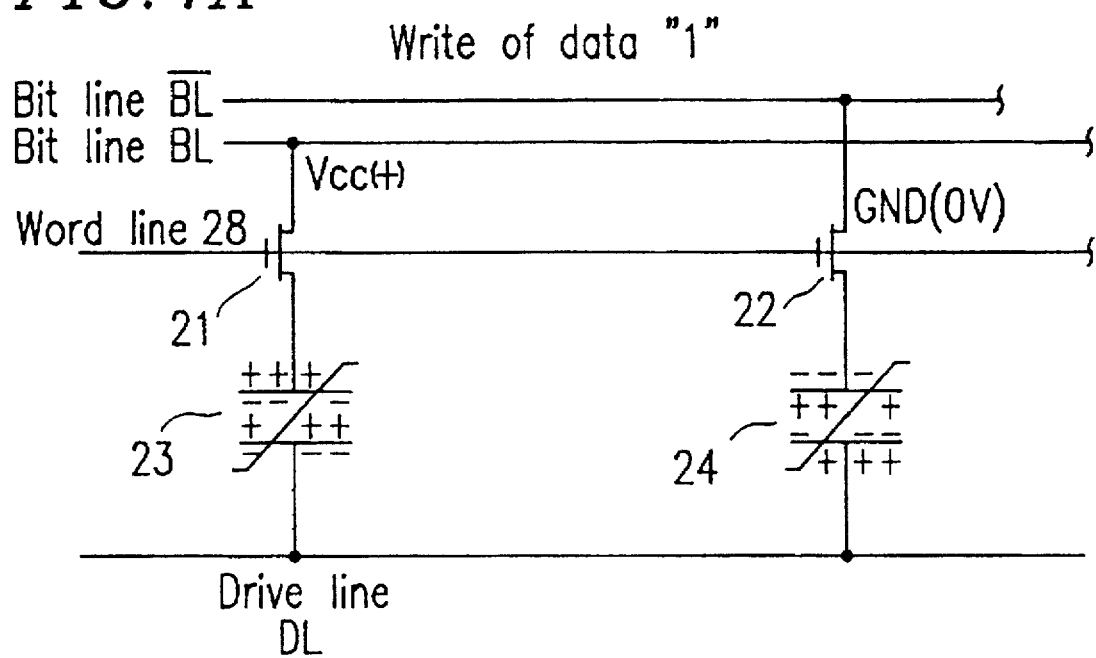
FIG. 4A and 4B are diagrams illustrating a write operation of data "1" into a memory cell of a non-volatile semiconductor memory device.
Figure 4B:
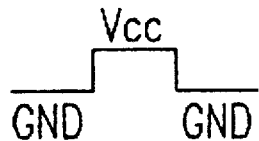
Figure 5A:
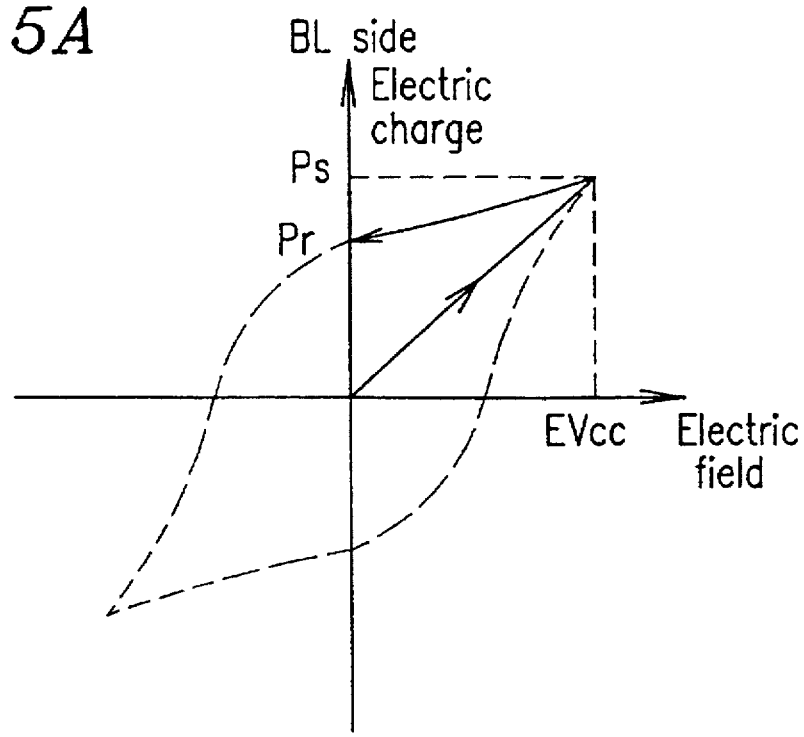
FIGS. 5A and 5B are graphs showing changes in the electric charge accumulated in a ferroelectric capacitor in a memory cell of a non-volatile semiconductor memory device at a time of writing data "1".
Figure 5B:
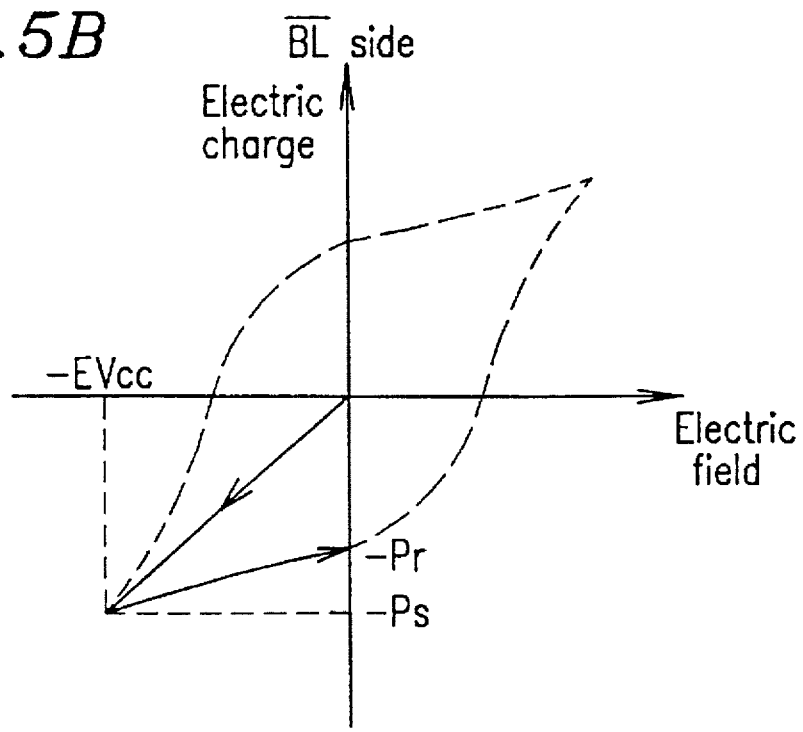

FIG. 1 is a diagram showing a configuration of a word line driving circuit 100 according to the present invention. The word line driving circuit 100 is connected to a word line WL of a ferroelectric memory. The ferroelectric memory can be configured in the same way as in the typical ferroelectric memory described with reference to FIG. 3. The word line WL corresponds to the word line 28 in FIG. 3.

The word line driving circuit 100 includes a row decoder 1, a level shift circuit 2, a power-on resent circuit 3, and transistor pairs 8 and 9. An output of the row decoder 1 is supplied to the level shift circuit 2 through an inverter. An output of the level shift circuit 2 is connected to the gates of an N-channel transistor QN3 and a P-channel transistor QP3 forming the transistor pair 8. On the other hand, an output of the power-on reset circuit 3 is connected to the gates of an N-channel transistor QN4 and a P-channel transistor QP4 forming the transistor pair 9 through an inverter. The word line WL is connected to a connection point of the N-channel transistor QN3 and the P-channel transistor QP3 forming the transistor pair 8.

At the power-on, both the word line and the drive line are connected to the ground potential GND. Moreover, the bit line BL and the complementary bit line /BL are precharged to the ground potential GND, respectively, for reading the non-volatile data.

In addition, the ferroelectric memory of the present invention is provided with a substrate voltage generating circuit. The circuit supplies a predetermined substrate voltage to the substrate on which the memory is provided. The configuration and function of such a substrate voltage generating circuit are known in the art, and the explanation therefor is omitted herein.

During an ordinary access operation, one row address is first selected by the row decoder 1. One word line WL corresponding to the selected row address is supplied with a voltage at a level Vpp through the level shift circuit 2 and the pair of transistors QP3 and QN3. Here, the voltage level Vpp refers to a boosted voltage obtained by boosting the power source voltage Vcc. On the other hand, word lines which are not accessed are grounded because the outputs of the row decoder 1 and the power-on reset circuit 3 are at a low level.

Figure 2:
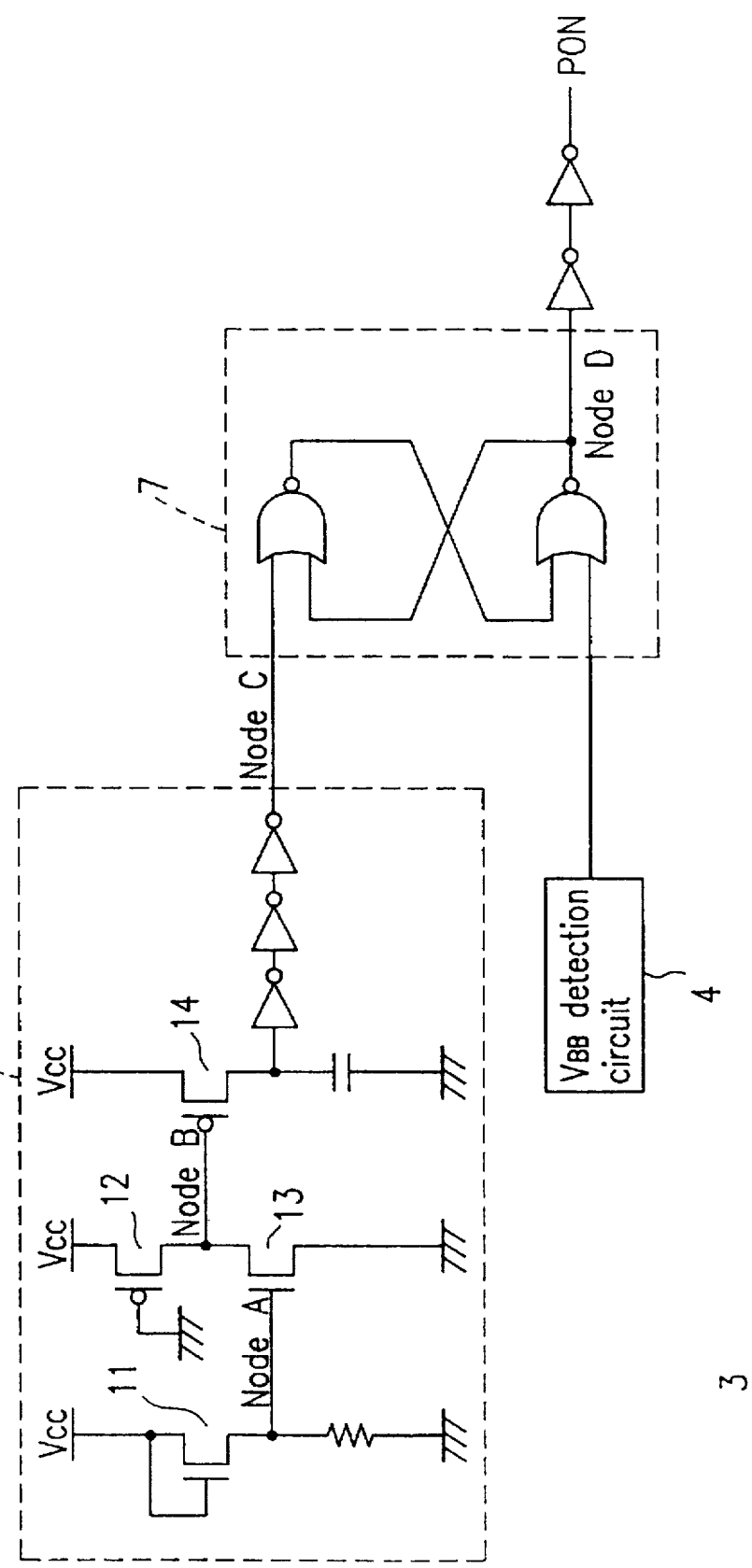
FIG. 2 is a diagram showing a configuration of a power-on reset circuit included in the word line driving circuit shown in FIG. 1.

FIG. 2 is a diagram showing a detailed configuration of the power-on reset circuit 3 shown in FIG. 1.

An electric potential of a node A is 0 volt before the power-on. When the power source voltage Vcc exceeds a threshold voltage of an N-channel transistor 11 included in a voltage level detecting portion 5 at the power-on, the N-channel transistor 11 is turned on. This allows the electric potential of the node A to start increasing.

The electric potential of the node A is given to a gate of an N-channel transistor 13. The N-channel transistor 13 remains in an Off-state until the electric potential of the node A reaches the threshold voltage of the N-channel transistor 13. During this time, the P-channel transistor 12 remains in an ON-state. As a result, an electric potential of a node B increases almost in accordance with changes in the power voltage Vcc. In accordance with this change, the electric potential of the node C which is obtained through a P-channel transistor 14 is at a high level immediately after the power-on.

However, the N-channel transistor 13 gradually becomes conductive along with the increase in the electric potential of the node A, so that the electric potential of the node B gradually decreases. As a result, it becomes difficult for the electric conduction of the transistor 13 to be kept. Therefore, the increase in the electric potential of the node A accelerates. Consequently, the electric potentials of the nodes A and C finally reach the power source voltage Vcc and 0 volt, respectively, along with the increase in the power source voltage Vcc.

Figure 8:
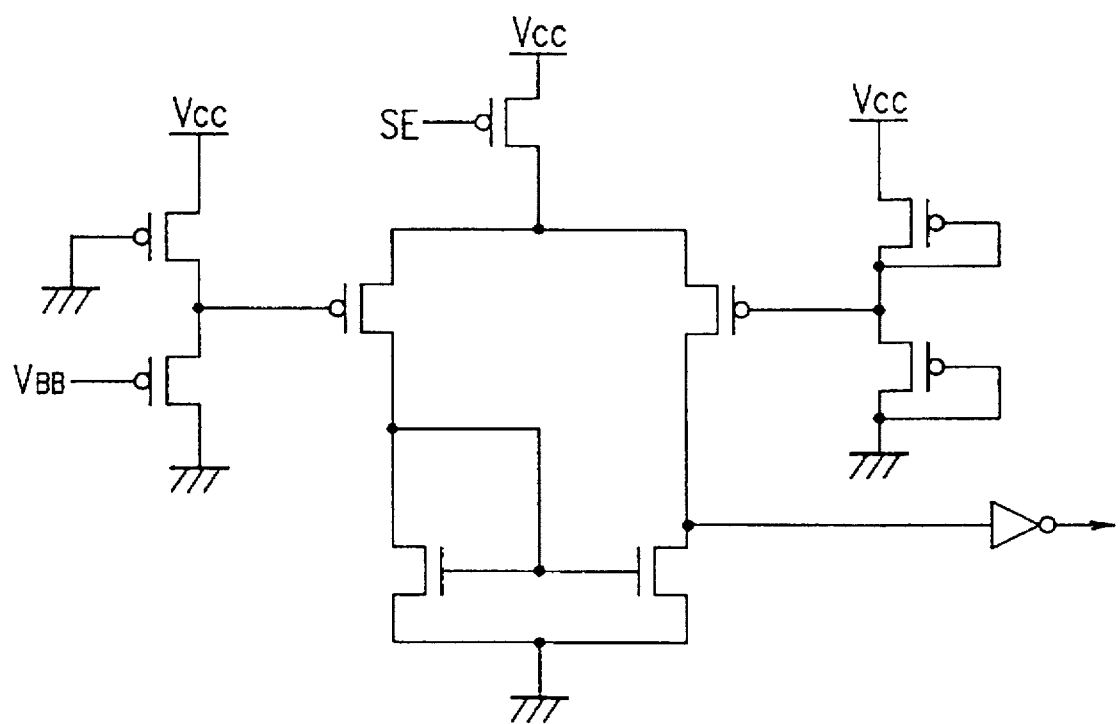
FIG. 8 is a circuit diagram showing an exemplary configuration of a VBB circuit included in the word line driving circuit shown in FIG. 1.

A VBB detection circuit 4 shown in FIG. 2 is configured in such a manner as to output a signal at a low level in the case where a substrate voltage VBB is at a predetermined voltage (e.g., −2 volts) or more and to output a signal at a high level in the case where the substrate voltage VBB is below the predetermined voltage. The VBB detection circuit 4 can be configured, for example as shown in FIG. 8. In the circuit configuration in FIG. 8, upon receiving the substrate voltage VBB and a control signal SE, the signal at a high level or a low level is output in accordance with levels of the substrate voltage VBB.

Immediately after the power-on, the electric potential of the node C which is an output from the voltage level detecting portion 5 is at a high level, while the electric potential of an output signal given from the VBB detection circuit 4 to the flip-flop circuit 7 is at a low level. As a result, an electric potential of an output node D of the flip-flop circuit 7 is at a high level immediately after the power-on. Even when the electric potential of the node C changes to a low level thereafter, the electric potential of the node D is not inverted. However, when the level of the substrate voltage VBB is sufficiently lowered and the output signal of the VBB detection circuit 4 changes to a high level, the electric potential of the node D changes to a low level.

More specifically, a signal at a high level is temporarily output from the power-on reset circuit 3 immediately after the power-on until the substrate voltage VBB is sufficiently lowered and stabilized. Here, the stabilized level of the substrate voltage VBB is, for example, in the range of about 31 2 volts to about −3 volts. As described above, while the output at a high level is obtained from the power-on reset circuit 3, the P-channel transistor QP4 included in the transistor pair 9 becomes conductive in the circuit configuration shown in FIG. 1, and the power source voltage Vcc is supplied to the source of the N-channel transistor QN3 included in the transistor pair 8. Consequently, the word line WL is supplied with a lower voltage among the power source voltage Vcc and a voltage obtained by subtracting the threshold voltage of the N-channel transistor QN3 from the output voltage of the level shift circuit 2.

Figure 6A:
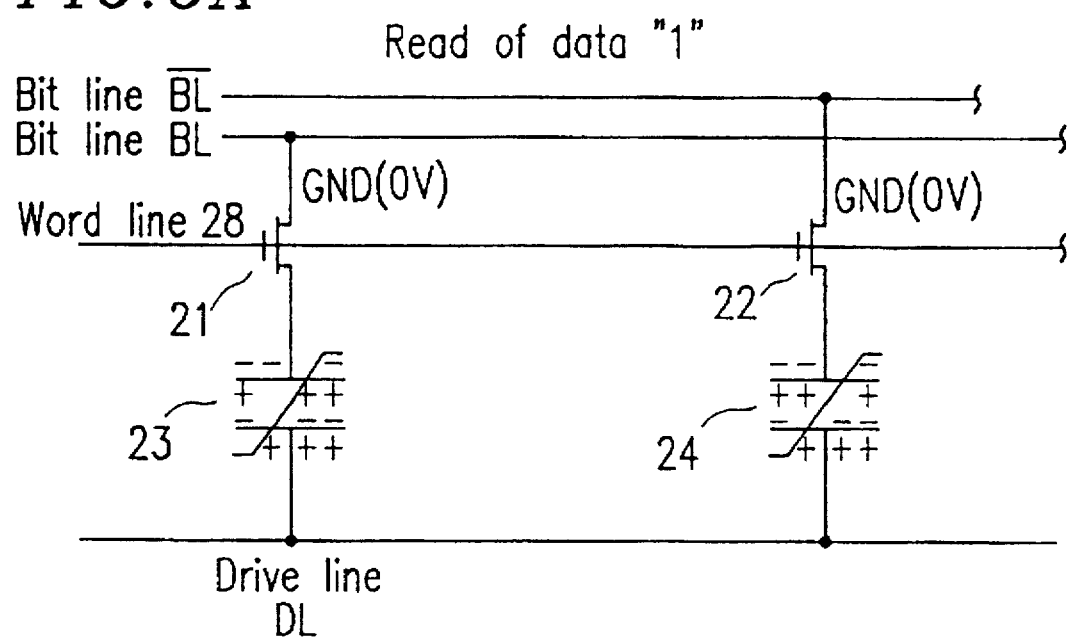
FIGS. 6A and 6B are diagrams illustrating a read operation of data "1" from a memory cell of a non-volatile semiconductor memory device.
Figure 6B:
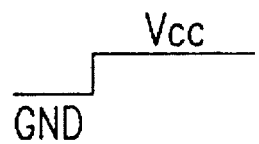
Figure 7A:
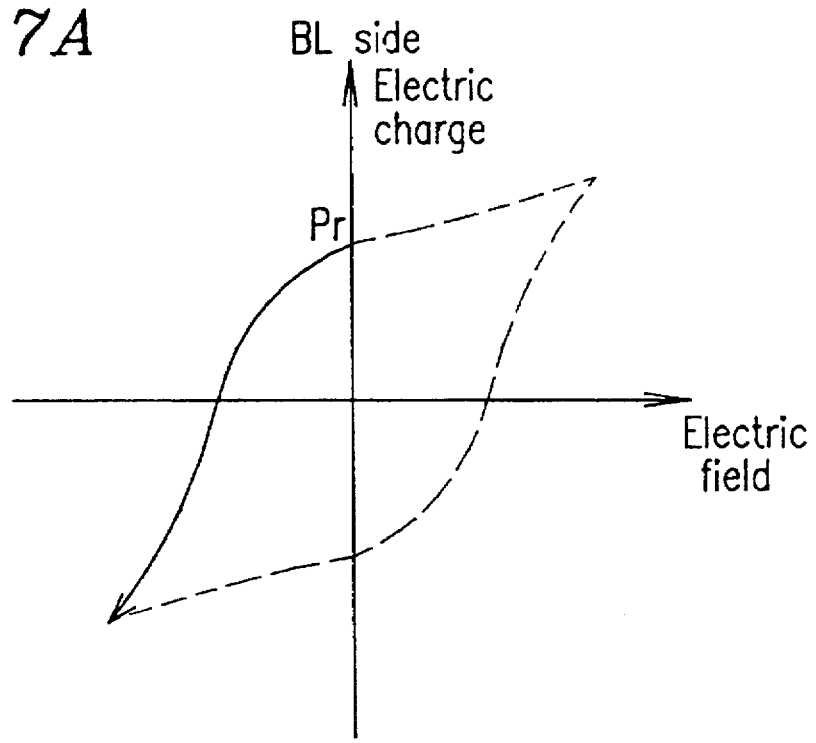
FIGS. 7A and 7B are graphs showing changes in the electric charge accumulated in a ferroelectric capacitor in a memory cell of a non-volatile semiconductor memory device at a time of reading data "1".
Figure 7B:
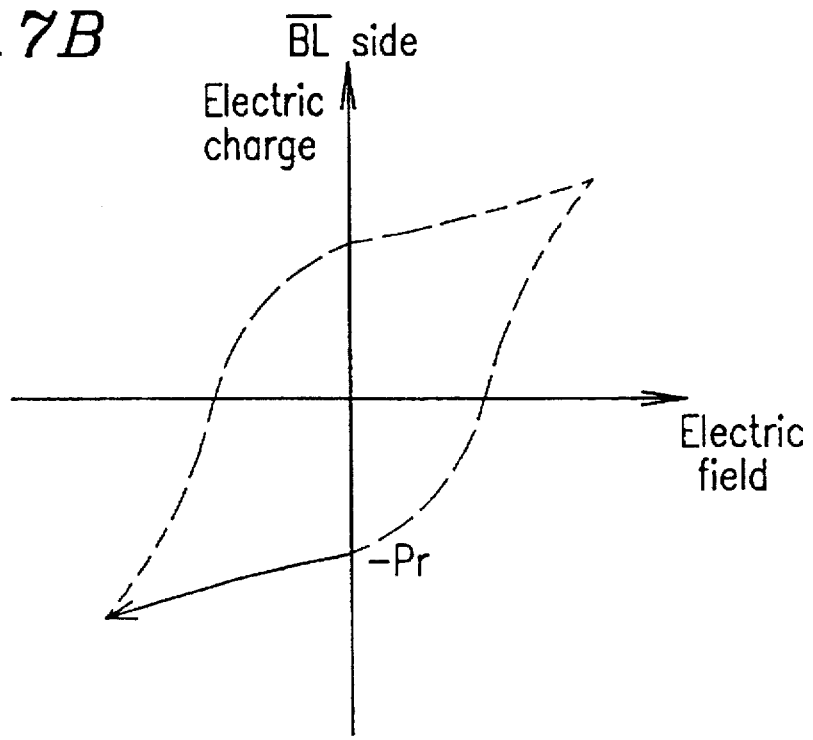

At this time, the electric potentials of charge-accumulated nodes of the ferroelectric capacitors 23 and 24 (see FIGS. 6A and 6B), which are included in a memory cell and connected to the word line WL, are subject to being lowered to 0 volt or less through coupling between the junction formed at the charge-accumulated node and the substrate, the electric potential of which is being lowered to negative values. Thus, even when the electric potential of the word line WL is at a low level, the MOS transistors 21 and 22 (see FIG. 6A and 6B) included in a memory cell become conductive. Therefore, the charge-accumulated nodes of the ferroelectric capacitors 23 and 24 are connected to the bit line BL or the complementary bit line /BL, and the electric potential of the charge-accumulated node becomes equal (i.e., is clamped) to the GND level which is the electric potential of the bit line BL or the complementary bit line /BL.

By electrically connecting the bit line and the charge-accumulated node of the ferroelectric capacitor so that the electric potential of the charge-accumulated node is clamped to the GND level equal to the bit line, even when the substrate voltage starts being generated and reaches a negative electric potential, the electric potential of the charge-accumulated node is not lowered in a negative direction. As a result, the ferroelectric film included in the ferroelectric capacitor is not applied with an electric field which is beyond the coercive electric field thereof. Thus, the non-volatile data recorded by utilizing a polarization state of the ferroelectric film is prevented from being damaged.

In normal writing and reading operations, the electric potentials of the bit line and the drive line are controlled in a similar manner as in the conventional art to set at the GND level at the power-on.

In the above explanation, the bit line potential is set at the GND level, so that the electric potential of the charge-accumulated node of the ferroelectric capacitor is clamped at the GND level which is the same level as the bit line potential. Consequently, an electric field which is beyond the coercive electric field (i.e., a voltage corresponding thereto) is prevented from being applied to the ferroelectric capacitor. Thus, the polarization direction of the ferroelectric film included in the ferroelectric capacitor is prevented from being inverted. However, it is not necessary to set the bit line potential at the GND level in the above process. The bit line potential can be set at a level different from the GND level, as long as the electric field to be applied to the ferroelectric film in the ferroelectric capacitor is smaller than the coercive electric field thereof (i.e., a voltage to be applied to the ferroelectric capacitor is smaller than the minimum voltage at which the polarization direction of the ferroelectric film is inverted).

On the other hand, when the substrate voltage VBB is lowered to a predetermined level or less, a signal at a low level is output from the power-on reset circuit 3. This allows the N-channel transistor QN4 included in the transistor pair 9 to become conductive, and a voltage at the GND level is supplied to the source of the N-channel transistor QN3 included in the transistor pair 8, whereby the word line WL is also supplied with a voltage at the GND level.

In order to clamp the electric potential of the charge-accumulated node of the ferroelectric capacitor to the GND level at the power-on, it is possible that an N-channel transistor is connected in parallel with the capacitor so as to be turned on at the power-on. However, according to this method, an area occupied by a chip increases because of the N-channel transistor disposed in parallel with the capacitor. In contrast, according to the present invention described above, the electric potential of the charge-accumulated node of the ferroelectric capacitor is clamped at the GND level at the power-on to prevent undesired polarization inversion, without increasing an occupied area of a chip.

As described above, in the configuration of the semiconductor memory device of the present invention, upon the power-on, the electric potential of the charge-accumulated node of the ferroelectric capacitor, which is likely to vary due to external disturbance such as changes in the substrate voltage VBB, is clamped at the same GND level as that of the drive line. This prevents the polarization direction of the ferroelectric film included in the ferroelectric capacitor from being inverted at an undesired timing and prevents non-volatile data recorded as a polarization direction from being damaged.

Although the above embodiment of the present invention is explained with reference to the case where the memory cell includes two of the ferroelectric capacitors and two of the switching transistors, the present invention is applicable also to a memory cell which has a different configuration. For example, the present invention is applicable to a memory cell of "1-transistor and 1-capacitor configuration" in which the memory cell includes one ferroelectric capacitor and one switching transistor. Moreover, the switching transistor can be of a different type other than a MOS transistor.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising:

a plurality of bit lines disposed on substrate;

a plurality of word lines and a plurality of data lines disposed on the substrate in a direction crossing with the bit lines;

a plurality of memory cells disposed in a matrix at portions corresponding to respective crossing points of the bit lines and the word lines, each of the plurality of memory cells having at least one switching transistor and at least one ferroelectric capacitor including a ferroelectric film as an insulating film to form a non-volatile ferroelectric memory strong information by a polarization direction of the ferroelectric film;

a substrate voltage generating circuit which supplies a negative substrate voltage to the substrate; and a power-on reset circuit which applies output which is a predetermined positive voltage selectively to at least one of the plurality of the word lines during a time period from power-on until the substrate voltage is stabilized.

2. A semiconductor memory device according to claim 1, wherein the output of the power-on reset circuit is at a high level during the time period from the power-one until the substrate voltage is stabilized, and turns low after the time period.

3. A semiconductor memory device according to claim 2, further comprising first connecting means for applying a boosted voltage to the word lines and second connecting means for applying the output of the power-on reset circuit to the word lines.

4. A semiconductor memory device according to claim 1, further comprising means for setting, at a predetermined level, an electric potential of a selected one of the plurality of the bit lines corresponding to a selected one of the plurality of the memory cells in the time period during which the output of the power-on reset circuit is applied to the word lines to set a voltage applied to the ferroelectric film of the ferroelectric capacitor at a value lower than a minimum voltage at which the poralization direction of the ferroelectric film is inverted.

5. A semiconductor memory device according to claim 4, wherein the predetermined level for the electric potential of the selected bit line is a ground potential.

* * * * *